(12) United States Patent
Lell et al.

(10) Patent No.: US 8,619,833 B2
(45) Date of Patent: Dec. 31, 2013

(54) BROAD AREA LASER HAVING AN EPITAXIAL STACK OF LAYERS AND METHOD FOR THE PRODUCTION THEREOF

(75) Inventors: Alfred Lell, Haidhof (DE); Stefanie Rammelsberger, Zeitlam (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/388,257

(22) PCT Filed: Jun. 28, 2010

(86) PCT No.: PCT/DE2010/000751
§ 371 (c)(1),
(2), (4) Date: Apr. 13, 2012

(87) PCT Pub. No.: WO2011/012100
PCT Pub. Date: Feb. 3, 2011

(65) Prior Publication Data
US 2012/0213241 A1    Aug. 23, 2012

(30) Foreign Application Priority Data

Jul. 31, 2009  (DE) .................... 10 2009 035 639

(51) Int. Cl.
*H01S 5/00*  (2006.01)
(52) U.S. Cl.
USPC ............... 372/50.23; 372/46.01; 372/46.014; 372/50.1; 438/700; 438/701
(58) Field of Classification Search
USPC .................. 372/46.01, 46.014, 50.1–50.124; 438/700, 701
See application file for complete search history.

(56) References Cited

U.S. PATENT DOCUMENTS

| 4,400,813 | A |   | 8/1983  | Kaminow |
| 4,525,841 | A | * | 6/1985  | Kitamura et al. ........ 372/46.012 |
| 5,299,219 | A |   | 3/1994  | Hayakawa |
| 2008/0273563 | A1 | | 11/2008 | Schmidt et al. |
| 2009/0092163 | A1 | | 4/2009  | Hirata et al. |
| 2009/0116525 | A1 | | 5/2009  | Shchukin et al. |

FOREIGN PATENT DOCUMENTS

| GB | 2 180 690 |   | 4/1987  |         |
| GB | 2 388 958 |   | 11/2003 |         |
| GB | 2388958 B | * | 8/2005  | ................ H01S 5/40 |
| JP | 1 175281  |   | 7/1989  |         |

(Continued)

OTHER PUBLICATIONS

Erbert, G. "Der Hochleistungsdiodenlaser-Vielseitiges Schlüsselbauelement mit Potenzial" Laser Technik Journal, vol. 2, No. 1, 2005, pp. 37-40.

(Continued)

*Primary Examiner* — Tod T Van Roy
(74) *Attorney, Agent, or Firm* — Cozen O'Connor

(57) ABSTRACT

A broad stripe laser (1) comprising an epitaxial layer stack (2), which contains an active, radiation-generating layer (21) and has a top side (22) and an underside (23). The layer stack (2) has trenches (3) in which at least one layer of the layer stack (2) is at least partly removed and which lead from the top side (22) in the direction of the underside (23). The layer stack (2) has on the top side ridges (4) each adjoining the trenches (3), such that the layer stack (2) is embodied in striped fashion on the top side. The ridges (4) and the trenches (3) respectively have a width (d1, d2) of at most 20 μm.

11 Claims, 5 Drawing Sheets

(56) References Cited

FOREIGN PATENT DOCUMENTS

| JP | 2007-157906 | * | 6/2007 | ............... H01S 5/12 |
| JP | 2007 157906 | | 6/2007 | |
| WO | WO 2009/080012 | | 7/2009 | |

OTHER PUBLICATIONS

Kelemen, M. et al. "Diodenlaser höchster Brillanz im nahen and mittleren Infrarot" Photonick, Jun. 2009, pp. 42-44.

Brüninghoff, S. et al. "8 W Single-Emitter InGaN Laser in Pulsed Operation" Phys. Status Solidi A, Feb. 5, 2009, pp. 1-4.

Furitsch, M. et al. "Comparison of Degradation of Mechanisms of Blue-Violet Laser Diodes Grown on SiC and GaN Substrates" Phys, Stat. Sol. (c), vol. 203, No. 7, pp. 1797-1801, May 2006.

Goto, S. et al. "Super High-Power AlGaInN-Based Laser Diodes with a Single Broad-Area Stripe Emitter Fabricated on a GaN Substrate" Phys. Stat. Sol. (a) 200, No. 1, Nov. 12, 2003, pp. 122-125.

Komorowska, K. et al. "High Power Blue Laser Mini-Bars" International Workshop on Nitride Semiconductors, IWN 2008, WS6-Opto 2: Technology and Devices, Session Th6-E-High Power Lasers, p. 266, oral presentation.

Rumbolz, C. et al. "Development of AlInGaN Based Blue-Violet Lasers on GaN and SiC Substrates" Phys. Stat. Sol. (a) 203, No. 7, May 22, 2006, pp. 1792-1796.

Scholz, D. et al. "Measurement and Simulation of Filamentation in (Al, In)GaN Laser Diodes" Optics Express, vol. 16, No. 10, May 12, 2008, pp. 6846-6859.

Takeya, M. et al. "High-Power AlGaInN Lasers" Phys. Stat. Sol. (a) 192, No. 2, Mar. 20, 2002, pp. 269-276.

* cited by examiner

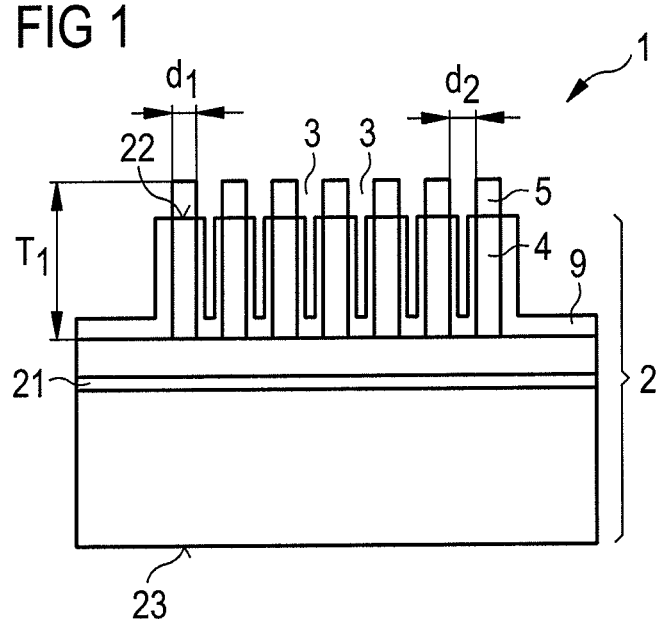
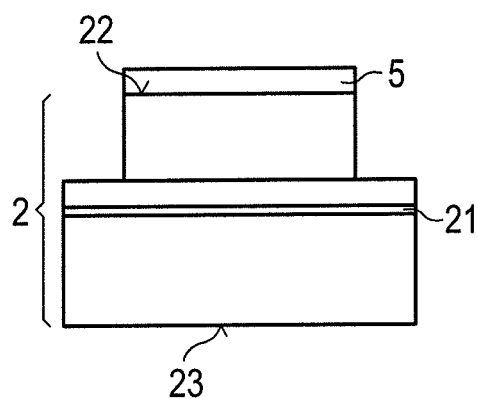
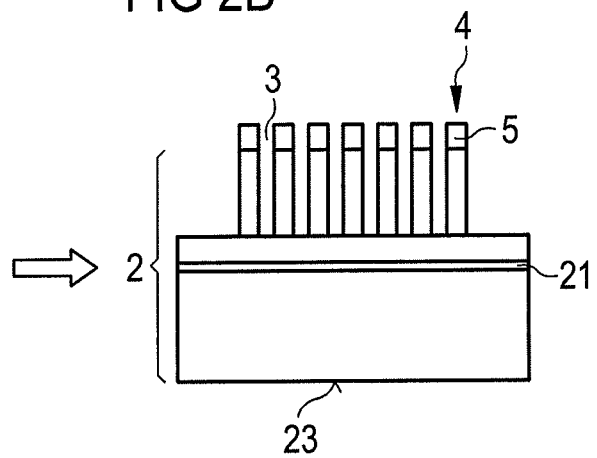

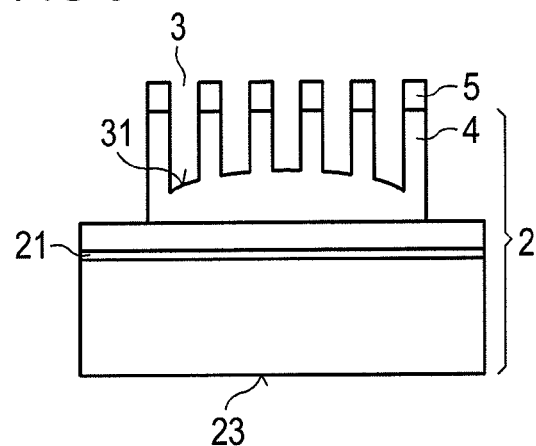
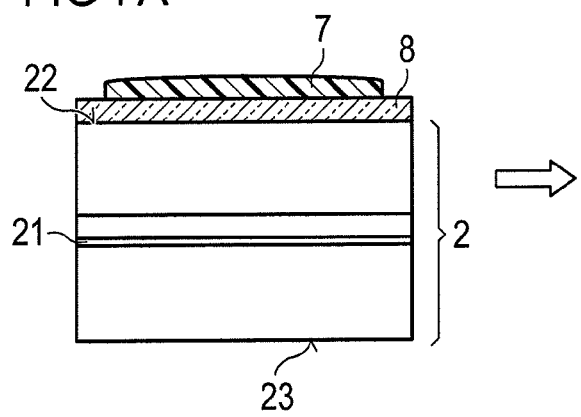
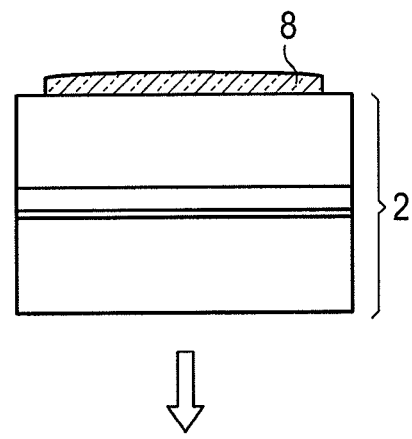
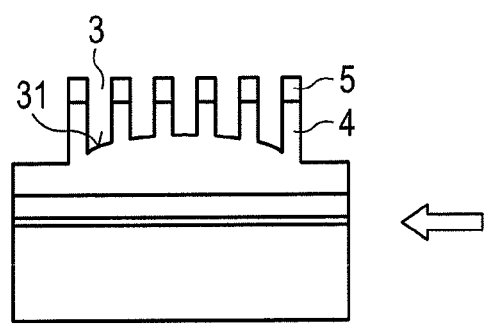
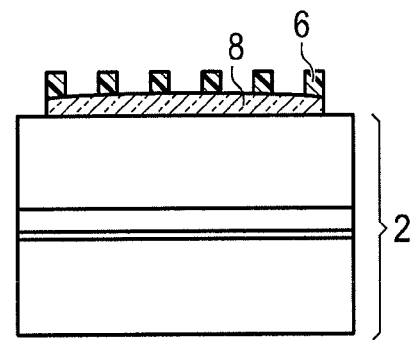

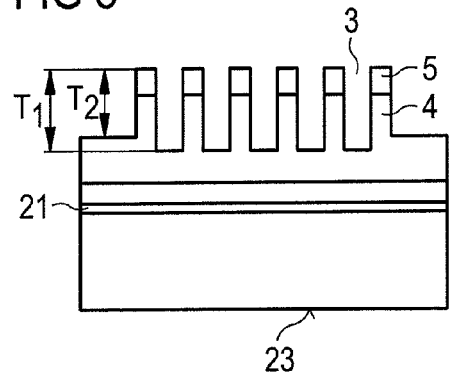
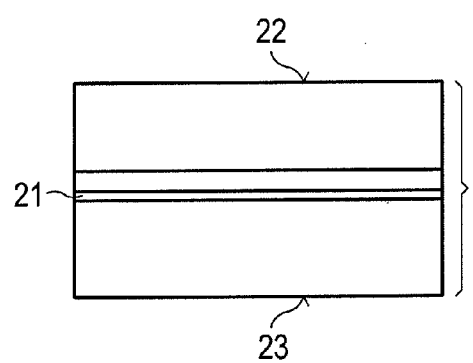
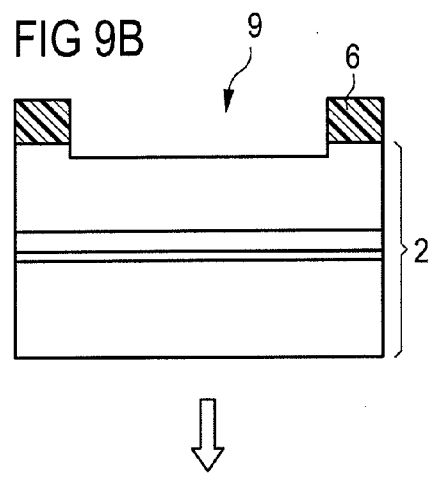
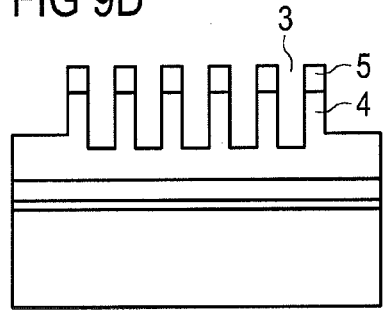
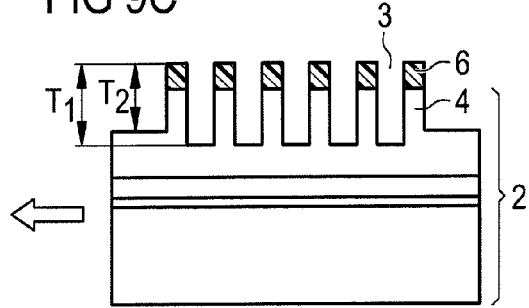

BROAD AREA LASER HAVING AN EPITAXIAL STACK OF LAYERS AND METHOD FOR THE PRODUCTION THEREOF

RELATED APPLICATIONS

This is a U.S. national stage of application No. PCT/DE2010/000751, filed on Jun. 28, 2010.

This patent application claims the priority of German Patent Application 10 2009 035 639.8filed Jul. 31, 2009, the disclosure content of which is hereby incorporated by reference.

FIELD OF THE INVENTION

The present invention relates to a broad stripe laser comprising an epitaxial layer stack, which contains an active, radiation-generating layer. Furthermore, the invention relates to a method for producing a broad stripe laser of this type.

BACKGROUND OF THE INVENTION

On account of their compactness and cost-effective production, semiconductor lasers find application in numerous areas of application such as, for example, data transmission, data storage, projection, material processing, optical pumping, biosensor technology and the like. Semiconductor lasers based on the AlInGaN material system, in particular, afford diverse possibilities for use on account of their generated radiation in the UV to blue or green wavelength range. In most fields of application, a high optical output power or output power density of the semiconductor laser is of importance in this case.

However, in the case of semiconductor lasers, the output power is limited on account of thermal effects. By way of example, in the case of so-called "single emitters", the output power is limited to a few hundred milliwatts in cw-operation.

Optical output powers can be increased, inter alia, by increasing the efficiency of the semiconductor laser, for example with the aid of an optimized epitaxy design of the layers of the semiconductor laser. However, in this case, too, the output power of semiconductor lasers of this type is limited to a few hundred milliwatts in cw-operation on account of thermal effects.

Power-increasing measures can furthermore be made possible for example by simultaneous operation of a plurality of laser diodes.

In addition, in the case of broad stripe lasers, as a result of the so-called "thermal lens", which constricts the laser mode of the laser to a few μm at high currents, there is the risk of the ridges arranged at the top side being damaged or even destroyed at high current densities.

SUMMARY OF THE INVENTION

One object of the invention is to provide an improved broad stripe laser having, in particular, an improved optical power density, an increased efficiency at high powers and an improved lifetime. Another object is to provide an improved, in particular simplified method for producing a broad stripe laser of this type.

These and other objects are attained in accordance with one aspect of the invention directed to a broad stripe laser comprising an epitaxial layer stack, which contains an active, radiation-generating layer and has a top side and an underside. The layer stack has trenches in which at least one layer of the layer stack is at least partly removed and which lead from the top side in the direction of the underside. The layer stack furthermore has on the top side ridges each adjoining the trenches, such that the layer stack is embodied in a striped fashion on the top side. The ridges and the trenches respectively have a width of at most 20 μm. Preferably, the ridges and the trenches respectively have a width of at most 10 μm, particular preferably of at most 7μm.

A broad stripe laser of this type accordingly has on the top side preferably index-guided, closely adjacent individual stripes, so-called ridges, having a width of less than 20 μm, preferably of less than 10 μm, particular preferably of less than 7 μm. In this case, adjacent ridges are at a distance from one another of at most 20 μm, preferably of at most 10 μm.

Consequently, unlike conventional practice, the broad stripe laser according to the invention does not have just one broad stripe on the top side. In particular, the broad stripe of the laser is split into individual stripes, the so-called ridges, according to the invention.

Broad stripe lasers of this type advantageously have an improved, in particular increased, optical output power and output power density in conjunction with reduced facet loading. Furthermore, the lifetime of broad stripe lasers of this type is thus advantageously increased, wherein these lasers can simultaneously have a beam profile optimized toward the respective application. In addition, the broad stripe laser according to the invention advantageously makes it possible to set the emission characteristic in a targeted manner between forward radiation, Gaussian profile and rectangular profile or mixtures thereof.

In particular, a broad stripe laser of this type makes it possible to shape the emission characteristic in a targeted manner through supervised control of the

- single-emitter density, in particular adjustable by way of the respective distance between the ridges,
- laser threshold currents, for example through control of the current spreading by means of index guiding and/or a different width of the individual ridges, and
- transconductance, for example through control of the losses,
- or combinations thereof.

Preferably, the broad stripe laser, in particular the epitaxial layer stack of the broad stripe laser, is based on InGaN, particularly preferably on InGaAlN. Preferably, the broad stripe laser is an edge emitter. Preferably, the broad stripe laser is a semiconductor, laser.

In one preferred configuration of the broad stripe laser, at least one layer of the layer stack on that side of the active, radiation-generating layer which faces the underside is n-doped and at least one layer of the layer stack on that side of the active, radiation-generating layer which faces the top side is p-doped.

Preferably, all the layers of the layer stack on that side of the active, radiation-generating layer which faces the underside are n-doped or undoped and all the layers of the layer stack on that side of the active, radiation-generating layer which faces the top side are p-doped or undoped.

The trenches of the broad stripe laser are preferably formed in the p-doped layer or the p-doped layers of the layer stack.

Preferably, the trenches do not penetrate through the active layer of the layer stack of the broad stripe laser. In this case, therefore, the trenches are only formed on the top side of the layer stack.

Alternatively, the trenches can penetrate through the active layer. In this case, the trenches are formed in all the layers of the layer stack which are situated on that side of the active, radiation-generating layer which faces the top side, and also in the active, radiation-generating layer.

Preferably, the ridges each have an identical height.

In one preferred configuration of the broad stripe laser, the trenches each have an identical depth. Alternatively, the trenches can have a different depth at least in part.

By way of example, the trench depth is smaller between the ridges than outside the original broad stripe. As a result, the higher facet loading of the central ridges can be counteracted by higher current spreading. Preferably, the difference in depth between the trenches has a stepped profile.

Alternatively, the index-defining trench depth can be higher between the ridges than outside the original broad stripe. As a result, the beam profile of the broad stripe laser can advantageously be controlled in a targeted manner by means of the depth-dependent gradient of the trenches.

In one preferred configuration of the broad stripe laser, adjacent ridges are in each case arranged at an identical distance from one another.

Alternatively, adjacent ridges can be arranged at a different distance from one another at least in part. Preferably, adjacent inner ridges are at a greater distance from one another than adjacent outer ridges. The different thermal loading of the ridges can thereby be counteracted.

In one preferred configuration of the broad stripe laser, the ridges have a different width at least in part.

Preferably, inner ridges have a larger width than outer ridges. A different build-up of oscillations that is caused, in particular, by a different thermal loading can thereby be counteracted, as a result of which the beam profile is advantageously influenced in a targeted manner.

In one preferred configuration of the broad stripe laser, the trenches each have a base area having a curvature in each case. The difference in depth between the trenches preferably has a graded profile. Thus, the higher facet loading of the central ridges can advantageously be counteracted by higher current spreading.

The curvatures of the base areas of the trenches are preferably embodied in lens-shaped fashion. Preferably, the base areas of the trenches together form a convex lens shape.

In one preferred configuration of the broad stripe laser, a connection layer is arranged at least in regions in each case on the ridges.

By way of example, the connection layer can completely cover a side of the ridges which faces away from the active layer. Alternatively, the connection layer can be embodied in a structured fashion in each case on the ridges.

Preferably, the connection layer is formed on the ridges in each case as a connection layer drawn back from two opposite edges of the layer stack. Furthermore, the connection layer can be formed on the ridges in each case as a connection layer provided with one or more openings. In this case, the openings in the connection layer can extend transversely relative to the respective ridge or along the respective ridge. As a result, regions with higher absorption can be produced in a targeted manner.

In regions of the openings in the connection layer, in a further preferred configuration of the broad stripe laser, it is possible to arrange further trenches which extend in regions vertically into the respective ridges, but do not completely penetrate through the latter.

In a further preferred configuration of the broad stripe laser, a passivation layer is arranged in some areas between the ridges and the connection layer. The passivation layer is preferably embodied in electrically insulating fashion. Consequently, in regions where the passivation layer is applied, there is no electrical contact between the layers of the ridges and the connection layer. In this case, the connection layer can be embodied over the whole area, the electrical connection between the connection layer and the layer stack not being formed over the whole area on account of the passivation layer.

Preferably a dielectric passivation is arranged on the top side of the epitaxial layer stack, no dielectric passivation being arranged on the ridges. In regions on the ridges, the dielectric passivation thus has a cutout in each case. Preferably, the dielectric passivation is embodied as a layer.

Preferably, the passivation layer and/or the dielectric passivation contains silicon dioxide ($SiO_2$), silicon nitride (SiN), aluminum oxide ($Al_2O_3$), hafnium oxide ($HfO_2$), zirconium oxide ($ZrO_2$) or tantalum oxide ($Ta_2O_5$).

In a further preferred configuration, a plurality of broad stripe lasers are arranged alongside one another as mutually separate arrays, wherein the distances between adjacent arrays are in each case preferably greater than 20 µm.

In a further preferred embodiment of the broad stripe laser, an optical lens or a lens system is disposed downstream of the laser in the emission direction. A broad stripe laser according to the invention, having a controlled emission characteristic, can advantageously be combined with an optical lens or a corresponding lens system in such a way that a desired imaging property is obtained.

Another aspect of the invention is directed to a method for producing a broad stripe laser comprising the following steps:
a) epitaxial growth of a layer stack on a growth substrate, wherein the layer stack has a top side and an underside,
b) top-side etching of the layer stack at two opposite edges of the layer stack in such a way that a broad stripe laser structure is formed, and
c) top-side etching of trenches in the layer stack in the region of the broad stripe laser structure in such a way that ridges are formed, each having a width of at most 20 µm, preferably of at most 10 µm, wherein adjacent ridges are at a distance from one another of at most 20 µm, preferably of at most 10 µm.

The conventionally known broad stripe laser structure is split in particular into individual stripes, in particular individual ridges. By virtue of a different width of the ridges and/or by virtue of different index guiding of the beam profile, the output power can be optimized toward the respective application of the laser. Consequently, an improved optical output power, an improved radiance and an increased lifetime are made possible, wherein, in particular, a simultaneously controllable optimization of the beam profile is made possible.

BRIEF DESCRIPTION OF THE DRAWINGS

Further features, advantages, preferred configurations and expediencies of the broad stripe laser and of the method for producing it will become apparent from the exemplary embodiments explained below in conjunction with FIGS. 1 to 13, in which:

FIGS. 1, 3, 4, 6, 8, 10, 11 and 12 in each case show a schematic cross section of an exemplary embodiment of a broad stripe laser according to the invention, FIGS. 2, 5, 7 and 9 in each case show a production method according to an embodiment of the invention for producing an exemplary embodiment of a broad stripe laser, and FIGS. 13A to 13C in each case show a plan view of an exemplary embodiment of a ridge of a broad stripe laser according to an embodiment of the invention.

DETAILED DESCRIPTION OF THE DRAWINGS

Figure 3:
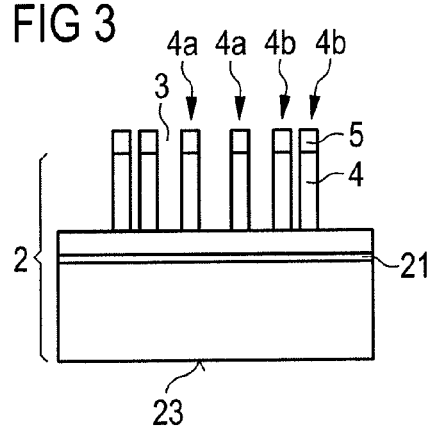

Identical or identically acting component parts are respectively provided with the same reference symbols. The component parts illustrated and also the size relationships of the component parts among one another should not be regarded as true to scale.

FIG. 1 illustrates a schematic cross section of a broad stripe laser having an epitaxial layer stack 2 comprising an active, radiation-generating layer 21. In particular, the layer stack 2 has a top side 22 and an underside 23. The layer stack 2 can be arranged for example on a substrate or a carrier (not illustrated).

Preferably, the layers facing the underside 23, as viewed from the active layer 21, have an n-type doping. The layers of the layer stack 2 which face the top side 22 as viewed from the active layer 21 preferably have a p-type doping. By way of example, magnesium or zinc can be used as p-type doping.

The laser is embodied as a broad stripe laser 1, in particular. In this case, the laser structure is etched in such a way that a narrow stripe is formed on the top side, as a result of which a high degree of index guiding is advantageously present as a result of the jump in refractive index of the laser structure with respect to air.

In the exemplary embodiment concerning FIG. 1, in particular, the p-doped layers of the broad stripe laser are removed apart from a narrow stripe, as a result of which the electrons are laterally restricted and diffusion is avoided.

The layer stack 2 furthermore has trenches 3 in which at least one layer of the layer stack is at least partly removed and which lead from the top side 22 in the direction of the underside 23. The broad stripe laser 1 therefore has further etching regions on the top side, wherein the broad stripe of the laser structure is split into individual stripes, so-called ridges. The layer stack 2, in particular the broad stripe of the broad stripe laser 1, is thus embodied in striped fashion on the top side.

The ridges 4 preferably have a width of at most 20 μm, preferably of at most 10 μm, particularly preferably of at most 7 μm. The trenches 3 separating adjacent ridges 4 from one another each have a width of at most 20 μm, preferably of at most 10 μm. Consequently, adjacent ridges 4 are in each case at a distance from one another of at most 20 μm, preferably of at most 10 μm.

As a result of the broad stripe of the laser being split into ridges 4, the beam profile and the output power can advantageously be optimized toward the respective application of the laser. In particular, the optimization can be obtained by means of a different ridge width and/or a different index guiding.

The broad stripe laser 1 having a broad stripe subdivided into ridges 4 advantageously enables an improved optical output power, an improved radiance and a lengthened lifetime. In particular, a controllable optimization of the beam profile is simultaneously made possible. Furthermore, the efficiency is advantageously increased at high powers.

In particular, the emission characteristic of a broad stripe laser of this type can be shaped in a targeted manner through, for example, supervised control of the single-emitter density (distance between the ridges), the laser threshold currents (for example through control of the current spreading by means of index guiding and/or by means of the different ridge width of the single emitters), and/or the transconductance (for example by means of control of the losses), or combinations thereof.

Preferably, the broad stripe laser 1 illustrated in FIG. 1 is an edge emitter.

The trenches 3 of the broad stripe laser 1 are produced by means of an etching process, for example. The etching depth $T_1$ in the exemplary embodiment in FIG. 1 is embodied, in particular, in such a way that the active layer 21 is not etched, in particular no trenches 3 are led through the active layer 21. Alternatively, the trenches 3 can penetrate through the active layer 21 (not illustrated).

In the exemplary embodiment in FIG. 1, the trenches 3 each have an identical depth $T_1$. The trench width $d_2$ is at most 20 μm. In particular, the distance between two adjacent ridges 4 is therefore at most 20 μm. The ridges 4 have a width $d_1$ of at most 20 μm, preferably 10 μm.

A dielectric passivation 9 is preferably arranged on the top side 22 of the layer stack 2, no dielectric passivation 9 being arranged on the ridges 4. In regions on the ridges 4, therefore, the dielectric passivation 9 has a cutout in each case. Preferably, the dielectric passivation 9 is embodied as a layer.

Preferably, the dielectric passivation 9 contains silicon dioxide ($SiO_2$), silicon nitride (SiN), aluminum oxide ($Al_2O_3$), hafnium oxide ($HfO_2$), zirconium oxide ($ZrO_2$) or tantalum oxide ($Ta_2O_5$).

In the further FIGS. 2 to 13, the dielectric passivation 9 is not illustrated in each case, for the sake of clarity. However, the dielectric passivation 9 is also employed in the further FIGS. 2 to 13, even though it is not explicitly shown.

A connection layer 5 is in each case arranged on the ridges 4. In the exemplary embodiment in FIG. 1, the connection layer 5 in each case completely covers that side of the ridges which faces away from the active layer 21. Consequently, the connection layer 5 is preferably arranged in each case in the cutouts of the dielectric passivation 9. The connection layer 5 is preferably embodied in striped fashion in the same way as the ridges 4, wherein the connection layer 5 in the exemplary embodiment of FIG. 1 is embodied as a continuous layer in each case in regions of the ridges. Preferably, the connection layer 5 on the ridges in each case has no cutouts or openings.

The trenches 3 are led through the connection layer 5 in the same way as through the ridges 4. The connection layer 5 is therefore embodied as a structured, in particular striped, connection layer, wherein the stripes of the connection layer 5 coincide with the ridges 4. In particular, only that side of the ridges 4 which faces away from the active layer 21 has the connection layer 5.

The connection layer 5 preferably comprises a metal or a metal alloy.

The broad stripe laser of the exemplary embodiment in FIG. 1 enables an increased optical output power or output power density, wherein the facet loading of the laser is reduced, the lifetime is advantageously increased and, at the same time, a beam profile optimized toward the respective application is made possible. In particular, a broad stripe laser embodied in this way makes it possible to set the emission characteristic in a targeted manner between forward radiation, Gaussian profile and rectangular profile or mixtures thereof.

Preferably, broad stripe lasers of this type having a controlled emission characteristic can be used in combination with lenses (not illustrated). In particular, a desired imaging property can be obtained with an optical lens or a corresponding lens system.

FIGS. 2A and 2B in each case illustrate production steps for producing a broad stripe laser in accordance with the exemplary embodiment in FIG. 1. In particular, FIG. 2A shows a conventional broad stripe laser, wherein the layer stack 2 is removed on the top side 22 in such a way that a broad stripe is formed on the top side.

Preferably, the broad stripe arises by means of a first etching process. In this case, the active layer 21 of the broad stripe laser is preferably not etched.

On the top side, the layer stack 2 has a connection layer 5 for making electrical contact with the broad stripe laser. On the underside, a substrate or a carrier can be arranged (not illustrated), wherein a further connection layer is preferably arranged on the underside for making electrical contact with the broad stripe laser (not illustrated).

Following the production of the broad stripe laser structure, trenches 3 are etched in the broad stripe arranged on the top side, such that the broad stripe is split, or subdivided, into ridges 4, see FIG. 2B. In this case, the ridges 4 preferably have a width $d_1$ of at most 20 µm, particular preferably of at most 10 µm. The etching width, that is to say the trench width $d_2$, is preferably at most 20 µm, preferably at most 10 µm. Two adjacent ridges 4 are, in particular, thus arranged at most at a distance from one another of 20 µm, preferably of at most 10 µm. In the exemplary embodiment in FIGS. 1 and 2, the etching depth $T_1$ of the individual trenches 3 is in each case approximately of the same magnitude. In particular, the etching depth $T_1$ is embodied in such a way that the active layer 21 of the broad stripe laser is not penetrated or etched.

Consequently, in the exemplary embodiment in FIG. 2, the conventionally known broad stripe laser structure is split by means of a further etching process into a plurality of equidistant ridges for having an identical width and etched to an identical depth.

Alternatively, the production of the broad stripe and the production of the ridges 4, that is to say the respective etching processes, can be effected in one etching step.

The exemplary embodiment in FIG. 3 differs from the exemplary embodiment in FIG. 1 in that adjacent ridges 4 are arranged at a different distance from one another at least in part. Preferably, adjacent inner ridges 4a are at a greater distance from one another than adjacent outer ridges 4b. However, the distance between the ridges 4a, 4b is at most 20 µm, preferably 10 µm. The different thermal loading can be counteracted by means of the different distances between adjacent ridges 4a, 4b. As a result, the lifetime of a broad stripe laser of this type is advantageously increased.

Figure 4:
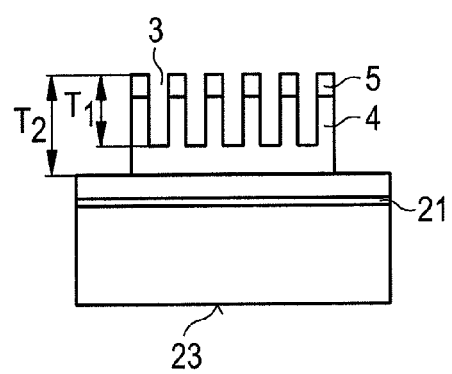

The exemplary embodiment in FIG. 4 differs from the exemplary embodiment in FIG. 1 in that the trenches 3 in the broad stripe structure of the laser have a smaller etching depth $T_1$. In particular, the trenches 3 do not completely penetrate through the broad stripe structure of the laser. The depth $T_2$ of the broad stripe structure of the laser is accordingly greater than the depth $T_1$ of the trenches 3.

Consequently, the broad stripe structure is split into a plurality of equidistant ridges 4 having an identical width, wherein the index-defining etching depth $T_1$ is smaller between the ridges 4 than outside the original broad stripe, in order to counteract the greater facet loading of the central ridges by means of a higher current spreading. The difference in etching depth from $T_1$ to $T_2$ preferably has a stepped profile.

FIGS. 5A to 5D illustrate individual production steps for producing a broad stripe laser in accordance with the exemplary embodiment in FIG. 4.

Figure 5A:
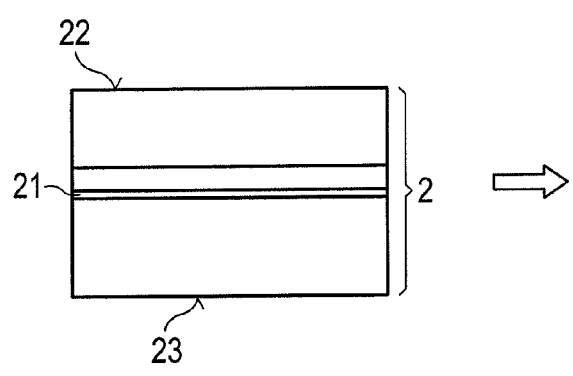
Figure 5B:
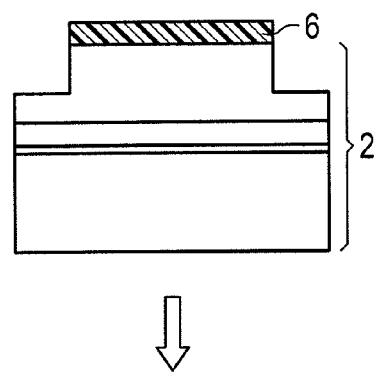

FIG. 5A shows a layer stack 2 having an active, radiation-generating layer 21, a top side 22 and an underside 23. At the top side 22, as illustrated in FIG. 5B, a broad stripe structure is formed by means of a first etching process. The etchings preferably do not lead through the active layer 21. The first etching step is effected, in particular, by means of a photoresist 6 formed on the top side 22 of the laser.

Alternatively, the first etching step, instead of the photoresist, can be effected by means of an etching mask formed on the top side 22 of the laser. The etching mask can be, for example, a dielectric or metallic hard mask.

Figure 5D:
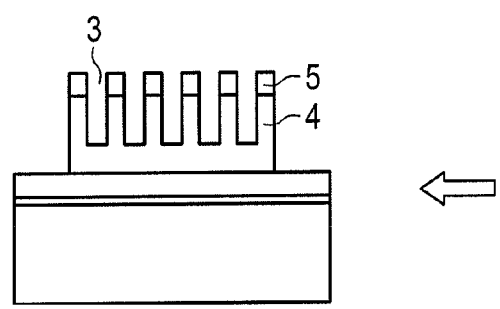
Figure 5C:
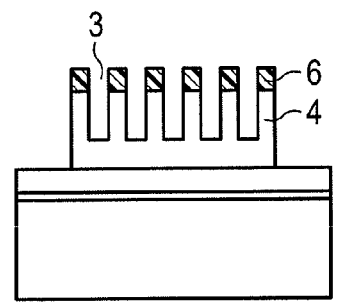

In a further etching process, trenches 3 are etched into the broad stripe structure, as illustrated in FIG. 5C. In this case, the etching depth of the trenches 3 is smaller here than the etching depth of the broad stripe structure.

Alternatively, the production of the broad stripe and the production of the ridges 4, in particular the first etching process and the further etching process, can be effected in one etching step.

In the last method step, as illustrated in FIG. 5D, the photoresist 6 is removed, a connection layer 5 being arranged on the ridges 4.

The exemplary embodiment in FIG. 6 differs from the exemplary embodiment in FIG. 4 in that the trenches 3 each have a base area 31 having a curvature in each case. The curvature of the base area 31 is preferably embodied in a lens-shaped fashion in each case. In particular, the curvatures of the base areas 31 together have a convex lens shape.

The trenches 3 thus have a different depth in the exemplary embodiment in FIG. 6. In particular, the broad stripe structure is split into a plurality of equidistant ridges 4 having an identical width, wherein the index-defining etching depth is smaller between the ridges than outside the original broad stripe in order to counteract the higher facet loading of the central ridges by means of a higher current spreading. In this case, the difference in etching depth preferably has a graded profile.

FIGS. 7A to 7D illustrate steps for producing a broad stripe laser in accordance with the exemplary embodiment in FIG. 6.

As illustrated in FIG. 7A, an etching auxiliary mask 8 is applied to the layer stack 2, in particular on the top side 22 of the layer stack 2. A photoresist 7 is arranged on the etching auxiliary mask 8, said photoresist preferably flowing as a result of a thermal treatment. By means of the flowing photoresist, it is possible to produce a lens-shaped structure of the etching auxiliary mask. In particular, the etching auxiliary mask is thus structured in a lens-shaped fashion, as illustrated in FIG. 7B. This structuring is preferably effected by means of dry-chemical transfer to the etching auxiliary mask 8.

In the next method step, as illustrated in FIG. 7C, a striped resist structure 6 is applied to the lens-shaped etching auxiliary mask 8. Afterward, by means of a further etching process, a single-stripe structure with graded index guiding is formed, as illustrated in FIG. 7D. In particular, ridges 4 and trenches 3 are thus formed on the top side in the layer stack 2, wherein the trenches 3 have a base area 31 having a respective curvature.

The exemplary embodiment in FIG. 8 differs from the exemplary embodiment in FIG. 4 in that the trenches 3 have a greater depth, in particular a greater etching depth $T_1$, than the broad stripe structure of the laser (depth $T_2$). In particular, the broad stripe structure is split into a plurality of equidistant ridges 4 having an identical width, wherein the index-defining etching depth $T_1$ is higher in a graded or stepped fashion between the ridges 4 than outside the original broad stripe, as a result of which the beam profile of the laser can advantageously be controlled in a targeted manner by means of the etching-depth-dependent gradient.

FIG. 9A to 9D in each case illustrate production steps for producing a broad stripe laser in accordance with the exemplary embodiment in FIG. 8.

In a manner similar to that in the exemplary embodiments in FIGS. 5A to 5D, a multi-stage etching process is employed in this case. A photoresist 6 is applied to the layer stack 2 in the edge region, see FIG. 9B, wherein here a first etching process takes place, which forms a first etching region 9 on the top side of the layer stack 2. Afterward, a striped resist structure is applied to the top side 22 of the layer stack 2 in regions of the first etching process 9, wherein a second etching process subsequently takes place, which etches trenches 3 into the top side 22 of the layer stack 2. In this case, in contrast to the exemplary embodiment in FIGS. 5A to 5D, the trenches 3 are etched with a depth such that the etching depth $T_1$ is higher than the etching depth $T_2$ of the broad stripe structure, see FIG. 9C. In the next method step, the striped resist structure 6 is removed, wherein a connection layer 5 is in each case applied to the ridges 4, see FIG. 9D.

Figure 10:
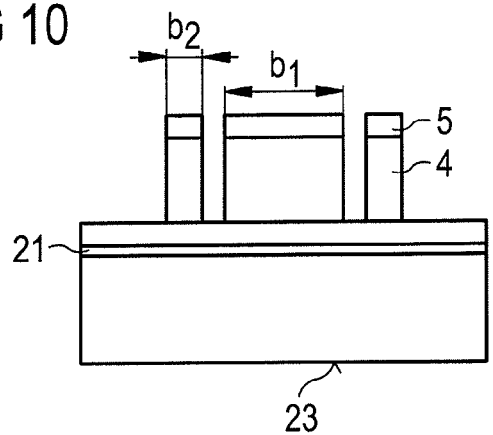

The exemplary embodiment in FIG. 10 differs from the exemplary embodiment in FIG. 1 in that the ridges 4 have a different width $b_1$, $b_2$. Preferably, inner ridges have a greater width $b_1$ than outer ridges (width $b_2$).

The broad stripe laser in accordance with the exemplary embodiment in FIG. 10 thus has a plurality of equidistant ridges 4 etched with an identical depth and having different widths, as a result of which a different oscillation build-up caused by a different thermal loading can advantageously be counteracted. As a result, the beam profile of the laser can advantageously be influenced in a targeted manner.

Figure 11:
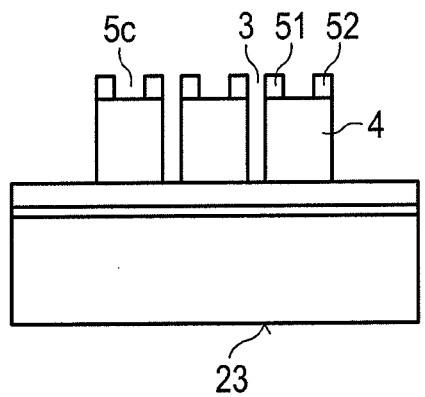

The exemplary embodiment in FIG. 11 differs from the exemplary embodiment in FIG. 1 in that the connection layer 51, 52 respectively arranged on the ridges 4 is structured. In particular, in contrast to the connection layer illustrated in FIG. 1, the connection layer 51, 52 has an opening 5c led along the respective ridge 4. The connection layer 51, 52 on the respective ridges 4 is accordingly embodied in striped fashion, wherein in this case the connection layer 51, 52 has two stripes 51, 52 arranged laterally on the ridges 4. Between the stripes 51, 52, the opening 5c in the connection layer is embodied such that no connection layer 51, 52 is arranged on the ridges 4 in some areas, in particular in the central region of the ridges 4.

The connection layer 51, 52 is thus preferably composed of gain-guided stripes, in particular metalization stripes.

Figure 13A:
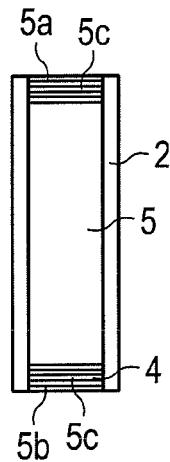
Figure 13B:
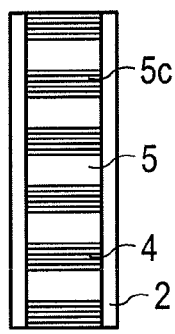
Figure 13C:
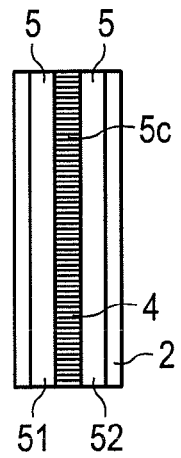

A plan view of a connection layer embodied in this way is illustrated in FIG. 13C, for example. The ridge 4 has laterally two connection layers 51, 52 which are led along the ridge 4 and are continuous, in particular. No connection layer is arranged centrally along the ridge 4.

Figure 12:
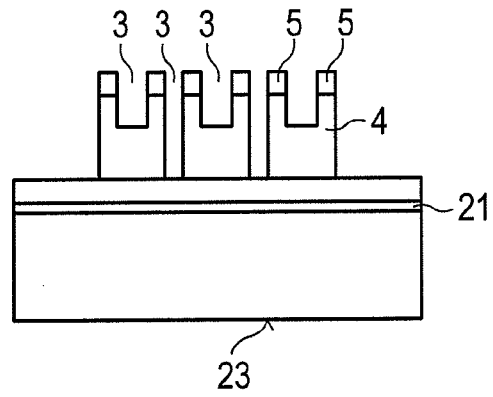

The exemplary embodiment in FIG. 12 differs from the exemplary embodiment in FIG. 11 in that the ridges have further etching depths in regions, in particular in the regions in which no connection layer 5 is applied. The connection layer 5 is arranged, in particular, in each case at a lateral region of the ridges 4, such that the further etching depths are formed centrally with respect to the ridges 4. The etching depths in particular do not lead completely through the ridges 4 vertically.

The exemplary embodiments in FIGS. 13A to 13C in each case illustrate a plan view of a ridge 4. In particular, the exemplary embodiments in FIGS. 13A to 13C in each case show additional modifications of the connection layer 5.

In FIG. 13A, the connection layer 5 is embodied as a connection layer that is not completely continuous. In particular, the connection layer 5 is formed on the ridges 4 in each case as a connection layer 5 drawn back from two opposite edges 5a, 5b of the ridges 4. Accordingly, the ridges 4 have no connection layer 5 in the edge region 5a, 5b. As a result, regions having a higher absorption can be produced in a targeted manner.

The exemplary embodiment in FIG. 13B differs from the exemplary embodiment in FIG. 13A in that the connection layer 5 has openings 5c. In particular, the connection layer 5 has a plurality of openings 5c transversely with respect to the ridge 4.

In contrast thereto, the exemplary embodiment in FIG. 13C has an opening 5c along the ridge 4. The connection layer 5 is accordingly split into two stripes 51, 52 extending along the ridge 4.

As an alternative to a connection layer 5 having openings 5c, a passivation layer can be arranged between the connection layer 5 and the ridges 4 (not illustrated). The passivation layer is electrically insulating, in particular, such that the connection layer 5 can be formed over the whole area, wherein the electrical contact between connection layer 5 and ridge is not formed over the whole area by means of the passivation layer. In particular, no electrical contact between the connection layer 5 and ridge 4 takes place in regions of the passivation layer. By way of example, the passivation layer contains silicon dioxide ($SiO_2$), silicon nitride (SiN), aluminum oxide ($Al_2O_3$) hafnium oxide ($HfO_2$), zirconium oxide ($ZrO_2$) or tantalum oxide ($Ta_2O_5$).

Furthermore, a plurality of broad stripe lasers in accordance with the exemplary embodiments of the broad stripe lasers in FIG. 1, 3, 4, 6, 8, 10, 11 or 12 can be arranged alongside one another as mutually separate arrays, wherein the distances between adjacent arrays are in each case preferably greater than 20 μm (not illustrated).

The invention is not restricted to the exemplary embodiments by the description on the basis of said exemplary embodiments, but rather encompasses any novel feature and also any combination of features, which in particular includes any combination of features in the patent claims, even if this feature or this combination itself is not explicitly specified in the patent claims or exemplary embodiments.

The invention claimed is:

1. A broad stripe laser comprising an epitaxial layer stack, which contains an active, radiation-generating layer and has a top side and an underside,
   wherein the layer stack has trenches in which at least one layer of the layer stack is at least partly removed and which lead from the top side in the direction of the underside,
   wherein the layer stack has on the top side ridges each adjoining the trenches, such that the layer stack is embodied in striped fashion on the top side,
   wherein the ridges and the trenches respectively have a width of at most 20 μm,
   wherein the trenches each have a base area having a curvature, and
   wherein the curvatures of all the base areas of the trenches together form a single convex lens shape.

2. The broad stripe laser according to claim 1, wherein at least one layer of the layer stack on that side of the active, radiation-generating layer which faces the underside is n-doped and at least one layer of the layer stack on that side of the active, radiation-generating layer which faces the top side is p-doped and the trenches are formed in the p-doped layer or the p-doped layers of the layer stack.

3. The broad stripe laser according to claim 1, wherein the layer stack is based on the InGaAlN material system.

4. The broad stripe laser according to claim 1, wherein the trenches have a different depth at least in part.

5. The broad stripe laser according to claim 1, wherein adjacent ridges are in each case arranged at an identical distance from one another.

6. The broad stripe laser according to claim 1, wherein a connection layer is arranged at least in regions in each case on the ridges.

7. The broad stripe laser according to claim 6, wherein the connection layer is formed on the ridges in each case as a connection layer drawn back from two opposite edges of the layer stack.

8. The broad stripe laser according to claim 6, wherein the connection layer is formed on the ridges in each case as a connection layer provided with one or more openings.

9. The broad stripe laser according to claim 6, wherein a passivation layer is arranged in at least one area between the ridges and the connection layer.

10. A method for producing a broad stripe laser comprising the steps of:
- epitaxial growth of a layer stack on a growth substrate, wherein the layer stack has a top side and an underside;
- top-side etching of the layer stack at two opposite edges of the layer stack in such a way that a broad stripe laser structure is formed; and
- top-side etching of trenches in the layer stack in the region of the broad stripe laser structure in such a way that ridges are formed, each having a width of at most 20 μm, wherein adjacent ridges are at a distance from one another of at most 20 μm,
- wherein the trenches each have a base area having a curvature, and
- wherein the curvatures of the base areas of all the trenches form a single convex lens shape.

11. A broad stripe laser comprising an epitaxial layer stack, which contains an active, radiation-generating layer and has a top side and an underside,
- wherein the layer stack has trenches in which at least one layer of the layer stack is at least partly removed and which lead from the top side in the direction of the underside,
- wherein the layer stack has on the top side ridges each adjoining the trenches, such that the layer stack is embodied in striped fashion on the top side, and
- wherein the ridges and the trenches respectively have a width of at most 20 μm,
- wherein the trenches each have a base area having a non-zero curvature, and
- wherein the non-zero curvatures of the base areas of all the trenches together form a single convex lens shape.

* * * * *